(12) United States Patent
Manku

(10) Patent No.: US 7,263,344 B2
(45) Date of Patent: Aug. 28, 2007

(54) METHOD FOR REDUCING IM2 NOISE IN A DOWN CONVERSION CIRCUIT

(75) Inventor: Tajinder Manku, Waterloo (CA)

(73) Assignee: Sirific Wireless Corporation, Waterloo, Ontario (CA)

(*) Notice: Subject to any disclaimer, the term of this patent is extended or adjusted under 35 U.S.C. 154(b) by 0 days.

(21) Appl. No.: 10/531,231

(22) PCT Filed: Oct. 15, 2003

(86) PCT No.: PCT/CA03/01574

§ 371 (c)(1),
(2), (4) Date: Oct. 27, 2005

(87) PCT Pub. No.: WO2004/036776

PCT Pub. Date: Apr. 29, 2004

(65) Prior Publication Data

US 2006/0148438 A1    Jul. 6, 2006

Related U.S. Application Data

(60) Provisional application No. 60/415,846, filed on Oct. 3, 2002.

(51) Int. Cl.
*H04B 1/26* (2006.01)
(52) U.S. Cl. .................. 455/323; 455/313; 455/296; 327/101; 327/117
(58) Field of Classification Search ............... 455/144, 455/424, 425, 456.5, 456.6, 561, 575.1, 550.1, 455/63.1, 67.11, 67.14, 147, 146, 189.1, 190.1, 455/192.1, 197.1, 255, 256, 258, 278.1, 283, 455/285, 295, 296, 302, 317, 323, 324, 326, 455/333, 334, 337, 313; 327/359, 362, 307, 327/333, 355, 117, 102, 116, 101; 375/324, 375/224, 147, 254, 316
See application file for complete search history.

(56) References Cited

U.S. PATENT DOCUMENTS

| 4,250,458 | A |   | 2/1981  | Richmond et al.          |
|-----------|---|---|---------|--------------------------|
| 4,394,626 | A | * | 7/1983  | Kurihara et al. ... 331/12 |
| 4,461,042 | A | * | 7/1984  | Tanabe et al. ... 455/333 |
| 5,303,417 | A | * | 4/1994  | Laws ... 455/314         |
| 5,375,146 | A |   | 12/1994 | Chalmers                 |
| 5,390,346 | A | * | 2/1995  | Marz ... 455/260         |
| 5,532,637 | A | * | 7/1996  | Khoury et al. ... 327/359 |

(Continued)

OTHER PUBLICATIONS

"Mini-Circuits Modern Mixer Terms Defined," 4 pages (1999).

(Continued)

*Primary Examiner*—Edward F. Urban
*Assistant Examiner*—Charles Chow
(74) *Attorney, Agent, or Firm*—Shin Hung; Borden Ladner Gervais LLP

(57) ABSTRACT

The present invention relates generally to communications, and more specifically to a method and apparatus for minimizing DC offset and second-order modulation products (IM2 noise) while demodulating RF signals. The principle of the invention can be applied to differential, down-conversion circuits (50) consisting of two differential mixers (54, 56) in series, a follows: a pair of current sources Ia and Ib are used to provide current to positive and negative channels of the first differential mixer (54). Providing current to the amplifying transistors of the first mixer (54) reduces the current drawn through the active mixer switches, reducing the noise generated. The current sources 1a and 1b are trimmed in a complementary manner where $1a = I + \text{Delta}1$, and $1b = \text{Delta}1$. The value of $\Delta 1$ can be determined in a number of manners; for example, it could be established by testing after the circuit has been fabricated, and the value stored on-chip, for future use.

9 Claims, 10 Drawing Sheets

U.S. PATENT DOCUMENTS

| | | | |
|---|---|---|---|
| 5,548,840 A | 8/1996 | Heck | |
| 5,793,817 A | 8/1998 | Wilson | |
| 5,859,559 A * | 1/1999 | Hong et al. | 327/359 |
| 6,041,077 A * | 3/2000 | Clark et al. | 375/224 |
| 6,144,846 A * | 11/2000 | Durec | 455/323 |
| 6,308,058 B1 * | 10/2001 | Souetinov et al. | 455/326 |
| 6,438,365 B1 * | 8/2002 | Balteanu | 455/326 |
| 6,606,359 B1 | 8/2003 | Nag et al. | |
| 6,711,396 B1 * | 3/2004 | Bergsma et al. | 455/317 |
| 6,801,761 B2 * | 10/2004 | Khorram | 455/326 |
| 6,882,834 B1 * | 4/2005 | Balboni | 455/255 |
| 6,937,670 B2 * | 8/2005 | Cowley et al. | 375/324 |
| 6,973,297 B1 * | 12/2005 | Manku et al. | 455/323 |
| 7,013,120 B2 * | 3/2006 | Gilmore | 455/285 |
| 7,130,604 B1 * | 10/2006 | Wong et al. | 455/302 |
| 7,138,857 B2 * | 11/2006 | Schelmbauer | 329/323 |
| 7,139,546 B1 * | 11/2006 | Petrov et al. | 455/323 |
| 2001/0041546 A1 * | 11/2001 | Kazakevich | 455/118 |
| 2002/0050861 A1 * | 5/2002 | Nguyen et al. | 330/254 |
| 2002/0160737 A1 * | 10/2002 | Allott et al. | 455/304 |
| 2003/0216128 A1 * | 11/2003 | Zhou | 455/127.1 |
| 2003/0216131 A1 * | 11/2003 | Kovacevic et al. | 455/326 |
| 2005/0087813 A1 * | 4/2005 | Lee et al. | 257/378 |

OTHER PUBLICATIONS

Bradshaw, P. "The ICL7650S: A New Era in Glitch-Free Chopper Stabilized Amplifiers," *Application Note*, vol. AN053.2, pp. 1-14, Jul. 2001.

Kim, B. et al., "Single-Ended Differential RF Circuit Topologies Utilizing Complementary MOS Devices," *Journal of Semi-Comductor Technology and Science*, vol. 2, No. 1, pp. 7-18, Mar. 2002.

Valero, A. et al.., "Direct Conversion Receiver Implementation Issues," *Texas A&M University*, Bluetooth Meeting, 18 pages, Mar. 2000.

Strange, J. et al., "Direct Conversion: No Pain, No Gain," *Communication Systems Design*, 6 pages, Apr. 2002.

Nygaard, K., "DC Coupled Amplifiers for Audio," 23 pages (2003).

Rudell, J. et al., "A 1.9GHz Wide-Band IF Double Conversion CMOS Integrated Receiver for Cordless Telephone Applications," *Department of Electrical Engineering and Computer Sciences, University of California at Berkley*, 7 pages (2003).

Waltari, M. et al., "Fully Differential Switched Opamp With Enhanced Common Mode Feedback," *Electronics Letters*, vol. 34, No. 23, 2 pages (1998).

"Power Opamp—Class AB," *Analog -Digital ASIC Design*, pp. 31-41 (2002).

\* cited by examiner

FIGURE 1 - PRIOR ART

METHOD FOR REDUCING IM2 NOISE IN A DOWN CONVERSION CIRCUIT

The present invention relates generally to communications, and more specifically to a method and apparatus for minimizing DC offset and second-order modulation products (IM2 noise) while demodulating RF (radio frequency) signals. The preferred embodiment of the invention marks a significant advance in satisfying the need for an inexpensive, high-performance, fully-integrable, receiver or transceiver.

BACKGROUND OF THE INVENTION

Many communication systems modulate electromagnetic signals from baseband to higher frequencies for transmission, and subsequently demodulate those high frequencies back to their original frequency band at the receiver. The original (or baseband) signal may contain, for example: data, voice or video content These baseband signals may be produced by transducers such as microphones or video cameras, be computer generated, or be transferred from an electronic storage device. In general, the use of high frequencies provides longer range and higher capacity channels than baseband signals, and because high frequency signals can effectively propagate through the air, they can be used for wireless transmissions as well as hard-wired or wave-guided communications.

All of these signals are generally referred to as RF (radio frequency) signals, which are electromagnetic signals; that is, waveforms with electrical and magnetic properties within the electromagnetic spectrum normally associated with radio wave propagation.

Wired communication systems which employ such modulation and demodulation techniques include computer communication systems such as local area networks (LANs), point-to-point communications, and wide area networks (WANs) such as the internet. These networks generally communicate data signals over electrically conductive or optical fibre channels. Wireless communication systems which may employ modulation and demodulation include those for public broadcasting such as AM and FM radio, and UHF and VHF television. Private wireless communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

The focus of this document is on down-conversion or demodulation; the conversion of high frequency signals to lower frequency levels. In the case of a wireless RF receiver, for example, demodulation would typically consist of down-converting a received signal from its carrier frequency to baseband.

Most RF receivers use the "super-heterodyne" topology for down-conversion, which provides good performance in a limited scope of applications, such as in public-broadcast FM radio receivers. As will be explained, the super-heterodyne's limitations make its use in more sophisticated modern applications expensive, and its performance poor.

The super-heterodyne receiver uses a two-step frequency translation method to convert an RF signal to a baseband signal. FIG. 1 presents a block diagram of a typical super-heterodyne receiver 10. The mixers labelled M1 12 and M2 14 perform the task of translating the RF signal to baseband, while the balance of the components amplify the signal being processed and filter noise from it.

The RF band pass filter (BPF1) 18 first filters the signal coming from the antenna 20 (note that this band pass filter 18 may also be a duplexer). A low noise amplifier 22 then amplifies the filtered antenna signal, increasing the strength of the RF signal and reducing the noise figure of the receiver 10. The signal is next filtered by another band pass filter (BPF2) 24 usually identified as an image rejection filter. The signal then enters mixer M1 12 which multiplies the signal from the image rejection filter 24 with a periodic signal generated by the local oscillator (LO1) 26. The mixer M1 12 receives the signal from the image rejection filter 24 and translates it to a lower frequency, known as the first intermediate frequency (IF1).

Generally, a mixer (such as M1 12 or M2 14) is a circuit or device that accepts as its input two different frequencies and presents at its output:

(a) a signal equal in frequency to the sum of the frequencies of the input signals;
(b) a signal equal in frequency to the difference between the frequencies of the input signals; and
(c) the original input frequencies.

The typical embodiment of a mixer is a digital switch which may generate significantly more tones than those stated above.

The IF1 signal is next filtered by a band pass filter (BPF3) 28 typically called the channel filter, which is centred around the IF1 frequency, thus filtering out the unwanted products of the first mixing processes; signals (a) and (c) above. This is necessary to prevent these signals from interfering with the desired signal when the second mixing process is performed.

The signal is then amplified by an intermediate frequency amplifier (IFA) 30, and is mixed with a second local oscillator signal using mixer M2 14 and local oscillator (LO2) 32. The second local oscillator LO2 32 generates a periodic signal which is typically tuned to the IF1 frequency. Thus, the signal coming from the output of M2 14 is now at baseband, that is, the frequency at which the signal was originally generated. Noise is now filtered from the desired signal using the low pass filter LPF 38, and the signal is passed on to some manner of presentation, processing or recording device. In the case of a radio receiver, this might be an audio amplifier and speaker, while in the case of a computer modem this may be an analogue-to-digital convertor.

Note that the same process can be used to modulate or demodulate any electrical signal from one frequency to another.

The main problems with the super-heterodyne design are:
- it requires expensive off-chip components, particularly band pass filters 18, 24, 28, and low pass filter 38;
- the off-chip components require design trade-offs that increase power consumption and reduce system gain;
- image rejection is limited by the off-chip components, not by the target integration technology;
- isolation from digital noise can be a problem; and
- it is not fully integratable.

The band pass and low pass filters 18, 24, 28 and 38 used in super-heterodyne systems must be high quality devices, so electronically tunable filters cannot be used. As well, the only way to use the super-heterodyne system in a multi-standard/multi-frequency application is to use a separate set of off-chip filters for each frequency band.

Direct-conversion topologies attempt to perform down-conversion in a single step, using one mixer and one local oscillator. In the case of down-conversion to baseband, this requires a local oscillator (LO) with a frequency equal to the carrier frequency of the input RF signal.

However, this technique will generate DC noise signals which interfere with low-frequency information contained in the demodulated baseband signal. These DC noise signals are particularly difficult to overcome because they are typically unpredictable and time-varying. Several mechanisms which may generate such DC noise signals in direct-conversion topologies include the following:
1. local oscillator leakage. Local oscillator (LO) power leaking to the RF input will result in DC levels at the mixer output because it will be mixed with itself. Because one of the output signals from a mixer is the difference between the two frequencies being mixed together, and the LO is generating a powerful signal at the same frequency as the carrier frequency of the incoming signal being demodulated, the LO signal itself is demodulated to generate a DC signal at the mixer output;
2. leakage of channel interferers. DC levels may be created at the mixer output when large nearby RF signals leak into the local oscillator port of the mixer and are self-mixed down to DC;
3. offsets due to mismatching in devices on a fully-integrated implementation;
4. 1/f noise at baseband. 1/f noise is noise with a power spectra that is inversely proportional to the frequency—in other words, the power of the noise signal is greater close to DC (direct current). 1/f noise, or "flicker noise" is generated largely by the charge trapping and de-trapping properties of MOSFETs; and
5. intermodulation products. Mixing generates sum and difference products from primary signals. Intermodulation products are distortions of those products, which may be generated by non-linearities in electronic components, or harmonics in the signals being mixed.

Hence, there is a potential for large, time-varying DC signals to interfere with the comparatively low-amplitude signals of interest, at or near DC, at the output of the demodulator.

A number of attempts have been made to reduce or compensate for the level of these DC noise signals, but none have been very effective or practical:
1. Capacitive Coupling
   Placing a capacitor in series with the signal path will block DC noise signals but will also block components of the desired signal near zero frequency.
   The severity of the data loss is dependent upon the transmission modulation and signal coding.
   Capacitive coupling also has the disadvantage that the size of the capacitors are generally too large for a fully integrated receiver.
2. Adaptive Feedback
   DC noise signals may also be removed by the use of adaptive feedback that time-averages the suspected DC offset value and subtracts the corresponding amount from a convenient point along the receive path. While feedback-based DC-offset reduction techniques are more effective than capacitive coupling and are more easily applied to integrated solutions, the following must be considered when they are applied:
   a. the increased level of complexity they add to the design;
   b. since the DC offsets and near DC offsets may be indistinguishable from the desired data, some amount of training time is normally required on a periodic basis to determine the DC offset accurately; and
   c. if a long-term average of the DC offset is used to estimate how much offset must be subtracted from the input, then this technique will not respond well to rapid variations in the DC offset level; and
3. Good Matching of Devices
   Mis-matching of transistors causes noise and adversely affects performance.
   The degree of mis-matching increases as component sizes decrease, so performance and yields drop with highly integrated applications. Typically, this problem is addressed by using large device sizes and/or using multiple components in parallel. Neither of these methods are highly effective and of course, result in larger components.

Thus, none of the currently used techniques for addressing the DC noise problem in direct-conversion architectures is particularly effective.

It is also of note that the continuing desire to implement low-cost, power efficient receivers has led to intensive research into the use of highly integrated designs, an increasingly important aspect for portable systems, including cellular telephone handsets. This has proven especially challenging as the frequencies of interest in the wireless telecommunications industry (especially low-power cellular/micro-cellular voice/data personal communications systems) have risen above those used previously (approximately 900 MHz) into the spectrum above 1 GHz.

Thus, there is a need for a method and apparatus for demodulation which addresses the problems above. It is desirable that this design be fully-integratable, inexpensive and high performance. As well, it is desirable that this design be easily applied to multi-standard/multi-frequency applications.

SUMMARY OF THE INVENTION

It is therefore an object of the invention to provide a novel method and system of modulation and demodulation which obviates or mitigates at least one of the disadvantages of the prior art.

One aspect of the invention is defined as a circuit for down-converting a differential input signal $x(t)$ comprising: a differential transconductance input cell consisting of separate positive and negative channels for receiving positive and negative channels of the input signal $x(t)$ and amplifying the positive and negative channels of the input signal $x(t)$; a first differential mixer for receiving the amplified input signal $x(t)$, and mixing the input signal $x(t)$ with a first mixing signal $\phi 1$, to generate an output signal $\phi 1\, x(t)$; a second differential mixer for receiving the signal $\phi 1\, x(t)$ as an input, and mixing the signal $\phi 1\, x(t)$ with a second mixing signal $\phi 2$, to generate an output signal $\phi 1\, \phi 2\, x(t)$; a pair of current sources $I_a$ and $I_b$ for providing current to respective outputs of the positive and negative channels of the differential transconductance input cell, to reduce the current drawn from the first differential mixer, the current sources $I_a$ and $I_b$ being trimmed in a complementary manner where $I_a = I + \Delta I$, and $I_b = I - \Delta I$.

Another aspect of the invention is defined as a method of A method of signal demodulation for a circuit having a differential transconductance input cell consisting of separate positive and negative channels for receiving positive and negative channels of the input signal $x(t)$ and amplifying the positive and negative channels of the input signal $x(t)$; a first differential mixer for receiving the amplified input signal $x(t)$, and mixing the input signal $x(t)$ with a first mixing signal φ1, to generate an output signal φ1 x(t); a second differential mixer for receiving the signal φ1 x(t) as an input, and mixing the signal φ1 x(t) with a second mixing signal φ2, to generate an output signal φ1 φ2 x(t); a pair of current sources Ia and Ib for providing current to respective ones of the positive and negative channels of the differential transconductance input cell, to reduce the drawn from the first differential mixer; the current sources Ia and Ib being trimmed in a complementary manner where Ia=I+ΔI, and Ib=I−ΔI; the method comprising the steps of: injecting a two-tone signal at the input; measuring IM2 at the baseband output of the circuit; determining the level of ΔI which minimizes IM2; recording the level of ΔI which minimizes IM2; and using the recorded level of ΔI during normal operation of the down-convertor.

A further aspect of the invention is defined as a method of down-converting a differential input signal x(t) comprising the steps of: amplifying positive and negative channels of the input signal x(t) using a differential transconductance input cell consisting of separate positive and negative channels; mixing the amplified input signal x(t) with a first mixing signal φ1, to generate an output signal φ1 x(t), using a first differential mixer; mixing the signal φ1 x(t) with a second mixing signal φ2, to generate an output signal φ1 φ2 x(t), using a second differential mixer, and providing current to respective ones of the positive and negative channels of the differential transconductance input cell, using a pair of current sources Ia and Ib, reducing the current drawn from the first differential mixer; and trimming the current sources Ia and Ib in a complementary manner where Ia=I+ΔI, and Ib=I−ΔI; wherein ΔI can be manipulated to reduce the IM2 and DC offset in the output signal φ1 φ2 x(t), and wherein matching parameters for the mixers can be relaxed.

BRIEF DESCRIPTION OF THE DRAWINGS

These and other features of the invention will become more apparent from the following description in which reference is made to the appended drawings in which.

DETAILED DESCRIPTION OF THE INVENTION

Figure 2:
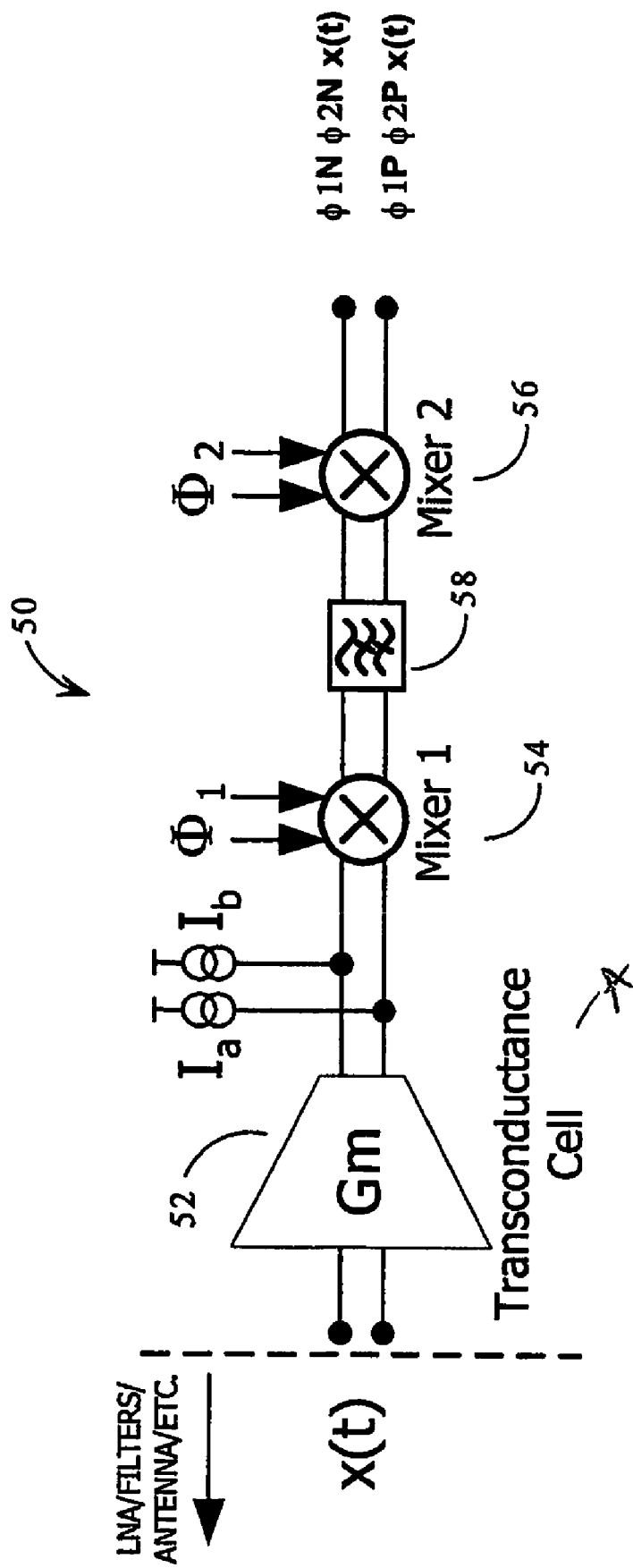
FIG. 2 presents a block diagram of a demodulator topology in a broad embodiment of the invention.

A circuit which addresses a number of the objects outlined above is presented as a block diagram in FIG. 2. This figure presents a demodulator or down-conversion topology 50 in which a differential input signal x(t) is down-converted by mixing it with two mixing signals φ1 and φ2. A "differential" signal is simply a signal which is available in the form of positive and negative potentials with respect to ground. Thus, this circuit handles an input signal in the form of a differential voltage, x(t)+, x(t)− as the radio frequency (RF) input signal.

Figure 1:
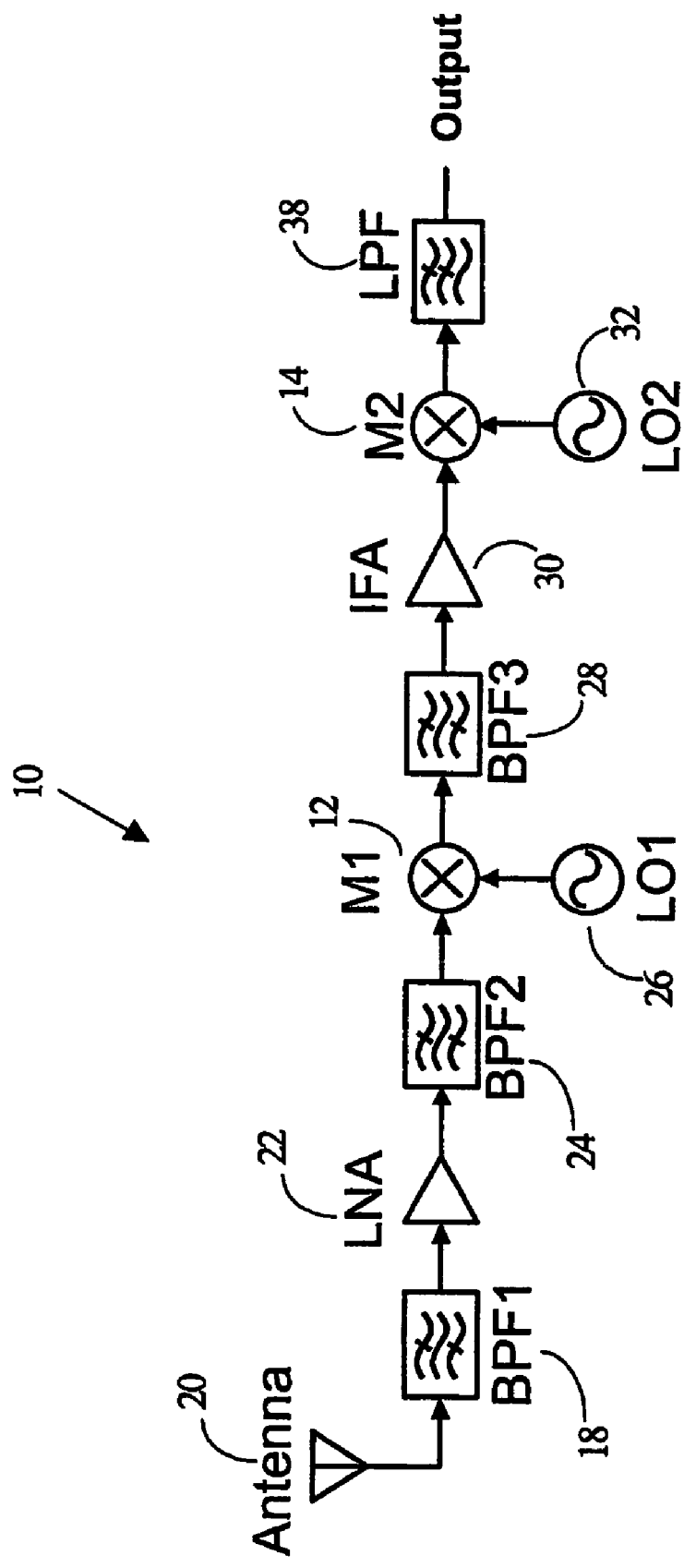
FIG. 1 presents a block diagram of a super-heterodyne receiver topology as known in the art.

The use of a differential architecture results in a stronger output signal that is more immune to common mode noise than a single ended architecture such as that of FIG. 1. If, for example, environmental noise imposes a noise signal onto the input of FIG. 1, then this noise signal will propagate through the circuit. If the same environment noise is imposed equally on the x(t)+ and x(t)− inputs of the differential circuit of FIG. 2, then the net effect will be null.

The circuit of FIG. 2 includes a differential transconductance input cell 52 which has separate positive and negative channels for receiving positive and negative channels of the input signal x(t). It amplifies the positive and negative channels of the input signal x(t), and passes the amplified signal to the first differential mixer 54. The input signal x(t) may come from any source, thus the differential transconductance input cell 52 may be connected to various low noise amplifiers, filters, antennas or other front end components. Typically, the transconductance input cell 52 will have high impedance inputs, but the invention is not restricted to such an implementation.

The first differential mixer 54 receives the amplified input signal and mixes it with the first mixing signal φ1, generating an output signal φ1 x(t). Similarly, the second differential mixer 56 receives the signal φ1 x(t) as an input, and mixes it with the second mixing signal φ2, to generate an output signal φ1 φ2 x(t).

The two mixing signals φ1 and φ2 may be of any form known in the art, including those of the form used in standard super-heterodyne architectures. In the preferred embodiment described hereinafter, a particularly useful paradigm of mixing signals referred to as "virtual local oscillator" or VLO signals, will be described, but the invention is not limited to VLO mixing signals.

Any differential mixers known in the art, or pairs of non-differential mixers could be used for the two mixers in this circuit. For example, the differential mixer described in the co-pending patent application filed in the United States on Mar. 8, 2002, under application Ser. No. 10/096,118, and titled "Integrated Circuit Adjustable RF Mixer", could be used.

The particular design parameters for the two mixers 54 and 56 would be dear to one skilled in the art, having the typical properties of an associated noise figure, linearity response, conversion loss, conversion compression, isolation, dynamic range, distortion conversion gain. The selection and design of these mixers would follow the standards known in the art.

The circuit also includes a pair of current sources Ia and Ib for providing current to respective outputs of the positive and negative channels of the differential transconductance input cell 52. These current sources reduce the current which must be drawn through the first differential mixer 54.

The operation of the invention will become more clear from the detailed description of the preferred embodiment which follows, with respect to FIGS. 5 through 9. In short, the components of the first differential mixer 54 must draw electrical current in the course of their operation for amplification and switching purposes (and possibly other functions). Providing current to RF amplifier transistors in the first differential mixer 54 from an external source such as Ia and Ib, means that the active mixer switches in the first differential mixer 54 are only required to provide a small proportion of the current required by the RF amplifier transistors. The reduced contribution of current via the active mixer switches, results in less noise being referred to the inputs of the RF amplifier transistors and also less noise being generated by the resistive load of the active mixer circuit, resulting in improved overall noise performance. At the same time, the total current flowing through the RF amplifier transistors can be maintained at a level sufficient to ensure their operation at the required gain and linearity.

It is also important that the current sources Ia and Ib be trimmed in a complementary manner where Ia=I+ΔI, and Ib=I−ΔI. The value of ΔI can be determined in a number of ways, including, for example, various feedback or testing techniques. In the preferred embodiment described hereinafter, the value of ΔI is determined by performing a two-tone test prior to regular operation of the circuit. The value of ΔI is adjusted during the course of this test to minimize second order modulation products at the output. The optimal value of ΔI is stored and used in the course of regular operation of the circuit.

As noted in the Background, DC noise terms or DC offsets are generated in the course of down-conversion. The circuit of the invention provides for DC offset correction in such away that the matching of devices is relaxed, making the circuit more robust and providing higher yields in an integrated environment Many additions and changes may be made to this circuit, and still allow the concept of the invention to be exploited. For example, the circuit of FIG. 2 may be provided with a filter 58 between the first and second mixers 54, 56 depending on the nature of the down-conversion model. In the case of traditional super-heterodyne conversion, for example, a bandpass filter may be used. In the case of VLO conversion described hereinafter, a high pass filter (HPF) may be used.

Though FIG. 2 implies that various elements are implemented in analogue form, they can also be implemented in digital form. The mixing signals are typically presented herein in terms of binary 1s and 0s, however, bipolar waveforms, ±1, may also be used. Bipolar waveforms are typically used in spread spectrum applications because they use commutating mixers which periodically invert their inputs in step with a local control signal (this inverting process is distinct from mixing a signal with a local oscillator directly).

A number of other embodiments of the invention will now be described, but first, the concept of virtual local oscillators (VLOs) will be described.

Virtual Local Oscillator (VLO) Signals

As noted above, it is preferable that the invention be implemented using virtual local oscillator (VLO) signals. VLO mixing signals are very different from mixing signals used in normal two-step conversion topologies (such as super-heterodyne topologies). Though two mixing signals are used in a VLO implementation, the two VLO signals are more comparable to the single mixing signal used in direction-conversion. The main difference from the direct-conversion approach is that two VLO mixing signals are used to emulate the single mixing signal, without the usual shortcomings of direct-conversion, such as self-mixing. This is because the two VLO mixing signals never really generate the LO signal being emulated.

When demodulating an input signal x(t) to baseband using direction-conversion, the usual practice is to mix the input signal x(t) with a signal f1 at the carrier frequency of the input signal x(t). The VLO philosophy is to emulate this demodulation using two (or more) mixing signals with a number of special properties:

1. their product emulates a local oscillator (LO) signal that has significant power at the frequency necessary to translate the input signal x(t) to the desired output frequency. For example, to translate the input signal x(t) to baseband, $\phi1(t)*\phi2(t)$ must have significant power at the carrier frequency f1, of x(t); and
2. one of either φ1 and φ2, has minimal power around the frequency of the mixer pair output $\phi1(t)*\phi2(t)*x(t)$, while the other has minimal power around the centre frequency, $f_{RF}$, of the input signal x(t). "Minimal power" means that the power should be low enough that it does not seriously degrade the performance of the RF chain in the context of the particular application.

For example, if the mixer pair is demodulating the input signal x(t) to baseband, it is preferable that one of either φ1 and φ2 has minimal power around DC.

As a result, the desired demodulation is affected, but there is little or no LO signal at the carrier frequency of the input signal x(t), to leak into the signal path and appear at the output.

Figure 3:
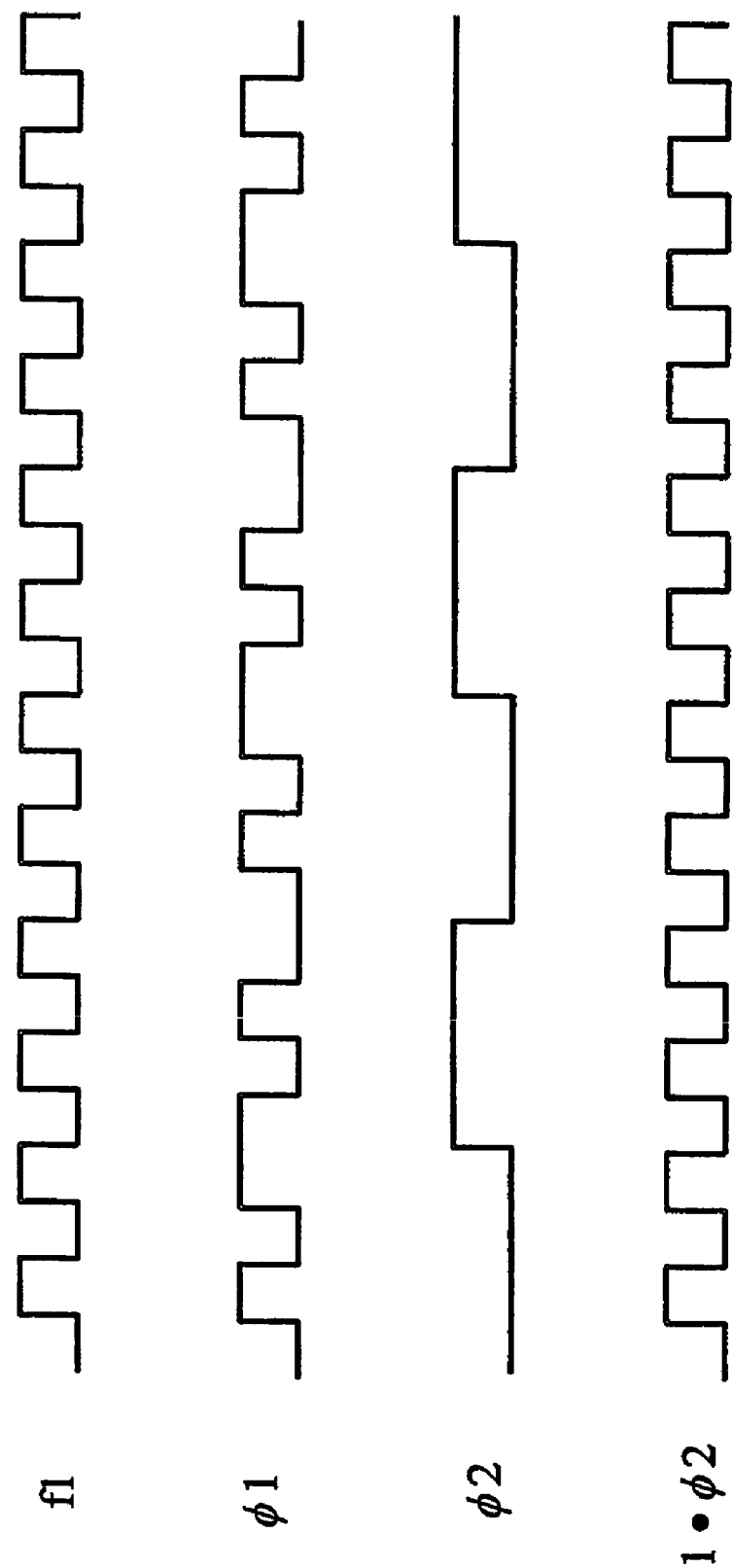
FIG. 3 presents a timing diagram showing the development of a pair of virtual local oscillator (VLO) mixing signals.

FIG. 3 presents an example of a suitable φ1 and φ2 mixing signal pair, which emulates the LO signal f1. In this embodiment, the first mixing operation (with the first mixer 52 of FIG. 2) is performed with the multi-tonal mixing signal φ1. Multi-tonal, or non-mono-tonal, refers to a signal having more than one fundamental frequency tone. Mono-tonal signals have one fundamental frequency tone and may have other tones that are harmonically related to the fundamental tone.

The resulting signal, φ1 x(t), is then mixed with the mono-tonal signal φ2 by means of the second mixer 54, generating an output signal φ1 φ2 x(t).

Looking at FIG. 3, it is clear that the product of these two mixing signals, φ1*φ2, has significant power at the frequency of the local oscillator signal f1 being emulated. However, neither φ1 nor φ2 have significant power at the frequency of the input signal x(t), the f1 LO signal being emulated, or the output signal φ1 φ2 x(t). Mixing signals with such characteristics greatly resolves the problem of self-mixing because the VLO signals simply do not have significant power at frequencies that will interfere with the output signal.

It is also important to note that at no point in the operation of the circuit is an actual "φ1*φ2" signal ever generated and if it is, only an insignificant amount is generated. The mixers 54, 56 receive separate φ1 and φ2 signals, and mix them with the input signal x(t) using different physical components. Hence, there is no LO signal which may leak into the circuit.

Looking at one cycle of these mixing signals from FIG. 3 the generation of the φ1*φ2 signal is clear:

| f1 | φ1 | φ2 | φ1 * φ2 |
|---|---|---|---|
| LO | LO | LO | LO |
| HI | HI | LO | HI |

-continued

| f1 | φ1 | φ2 | φ1 * φ2 |
|----|----|----|---------|
| LO | LO | LO | LO |
| HI | HI | LO | HI |
| LO | HI | HI | LO |
| HI | LO | HI | HI |
| LO | HI | HI | LO |
| HI | LO | HI | HI |

Clearly, the two mixing signals φ1 and φ2 in FIG. 3 satisfy the criteria for effective VLO signals.

The design of circuits for the generation of such signals would be clear to one skilled in the art from the teachings herein. A large number of suitable circuits are also described in the Applicant's related, co-pending patent applications:

1. PCT International Application Serial No. PCT/CA00/00995 Filed Sep. 1, 2000, titled: "Improved Method And Apparatus For Up-Conversion Of Radio Frequency (RF) Signals";
2. PCT International Application Serial No. PCT/CA00/00994 Filed Sep. 1, 2000, titled: "Improved Method And Apparatus For Down-Conversion Of Radio Frequency (RF) Signals"; and
3. PCT International Application Serial No. PCT/CA00/00996 Filed Sep. 1, 2000, titled: "Improved Method And Apparatus For Up-And-Down-Conversion Of Radio Frequency (RF) Signals".

The problems of image-rejection, LO leakage and 1/f noise in highly integrated transceivers can be largely overcome by using these VLO signals.

It would be clear to one skilled in the art that VLO signals may be designed which provide the benefits of the invention to greater or lesser degrees. While it is possible in certain circumstances to have almost no LO leakage, it may be acceptable in other circumstances to incorporate VLO signals which still allow a degree of LO leakage.

Voltage controlled oscillators (VCOs) are typically used to generate VLO mixing signals. As a general rule, it is desirable to use oscillators which operate at frequencies which will not adversely affect the data signal if any self-mixing occurs, for example using a VCO at a multiple or divisor of the LO signal being emulated.

Figure 4:
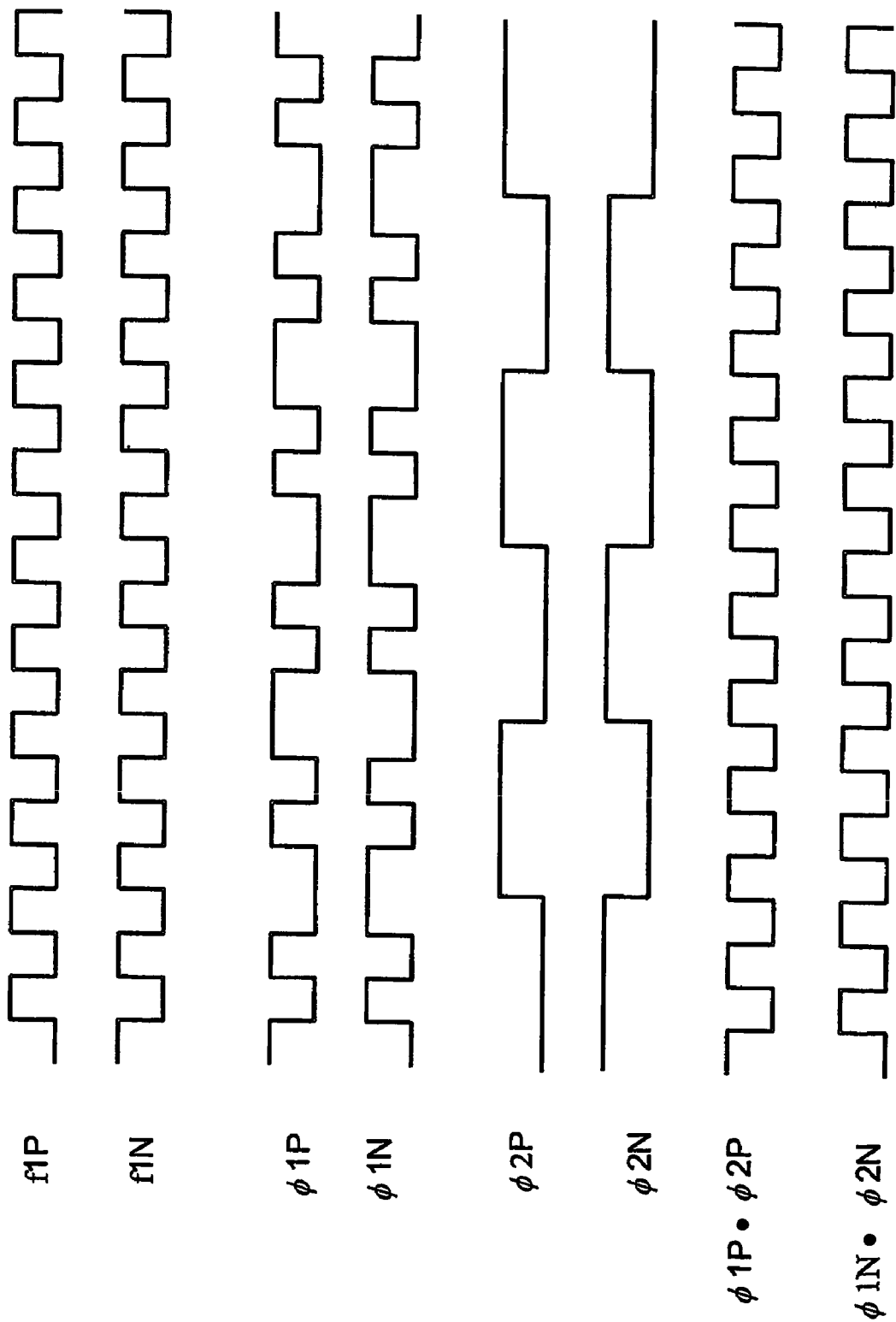
FIG. 4 presents a timing diagram of a set of differential VLO mixing signals plotted in amplitude versus time, in an embodiment of the invention.

FIG. 4 presents a timing diagram similar to that of FIG. 3, for the generation of differential VLO mixing signals. From the description of FIG. 3 above, the development of FIG. 4 follows logically.

The goal in this case, is to generate a set of differential mixing signals φ1P, φ1N, φ2P and φ2N, where φ1P and φ2P combine to emulate the positive channel of the LO signal (f1P), and φ1N and φ2N combine to emulate the negative channel of the LO signal (f1N). The positive and negative pairings of VLO signals are simply polar complements of one another.

As noted above, the input signal x(t) is down-converted to baseband using the two mixers 54, 56 and differential mixing signals φ1P, φ1N, φ2P and φ2N. Because differential mixing signals are employed, positive and negative pairings must be generated for each of φ1 and φ2. Each pairing of positive and negative signal components are simply complements of one another, so the pattern of these signals follows logically from the amplitude versus time graph of FIG. 3. For completeness however, the development of these signals are shown in the amplitude versus time graph of FIG. 4.

In operation, the monotonal signal φ1P is mixed with the x(t)+ input, and then φ1P*x(t)+ is mixed with the non-monotonal φ2P. Clearly, the product φ1P*φ2P is equal to f1P, so it emulates the f1P signal without generating significant power at the f1P frequency. Similarly, in operation, the monotonal signal φ1N is mixed with the x(t)− input, and then φ1N*x(t)− is mixed with the non-monotonal φ2N. Again, the product φ1N*φ2N is equal to f1N, so it emulates the f1N signal without generating significant power at the f1N frequency.

Exemplary Circuit

Figure 5:
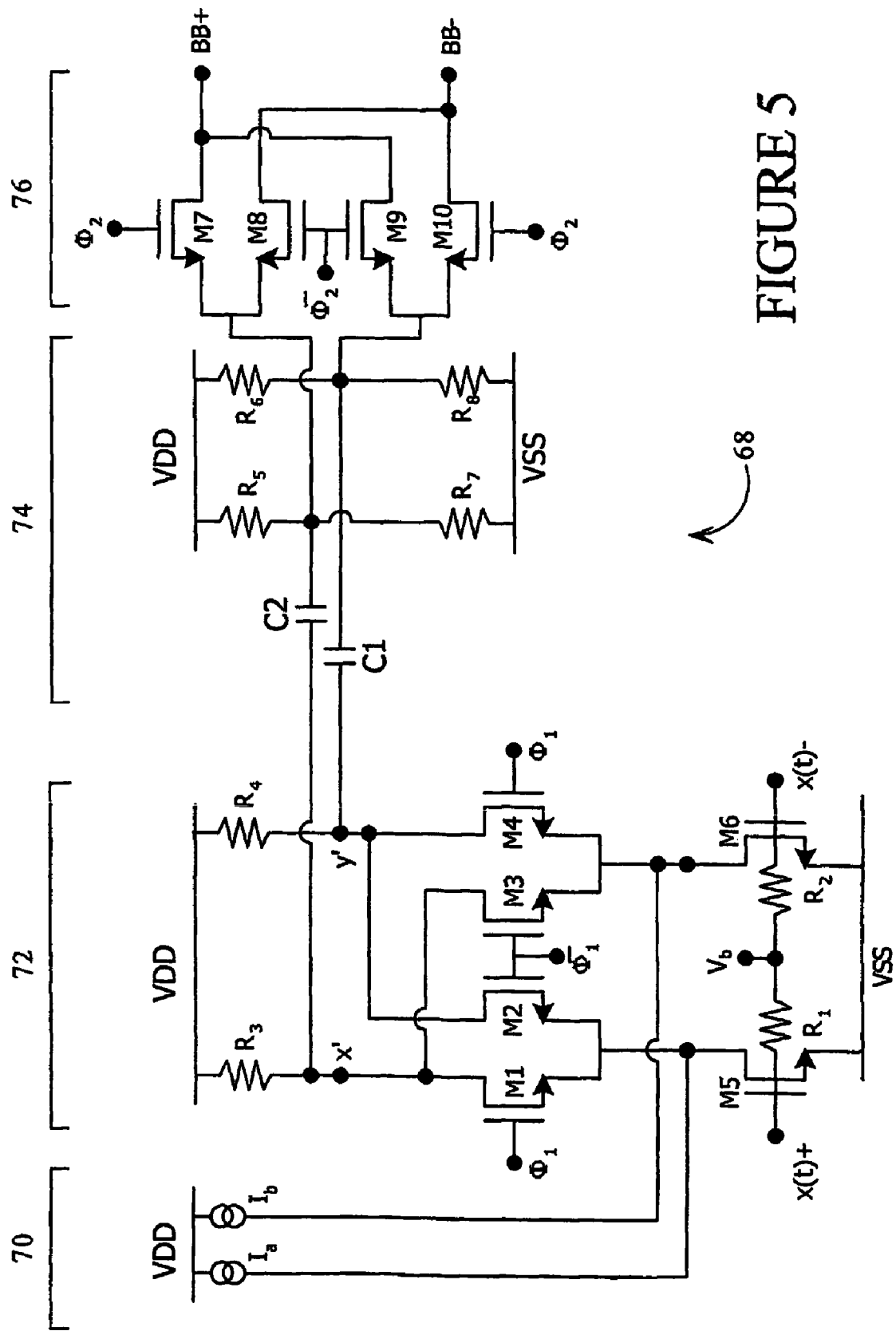
FIG. 5 presents an electrical schematic diagram of a differential demodulator topology in CMOS, in an embodiment of the invention.
Figure 6:
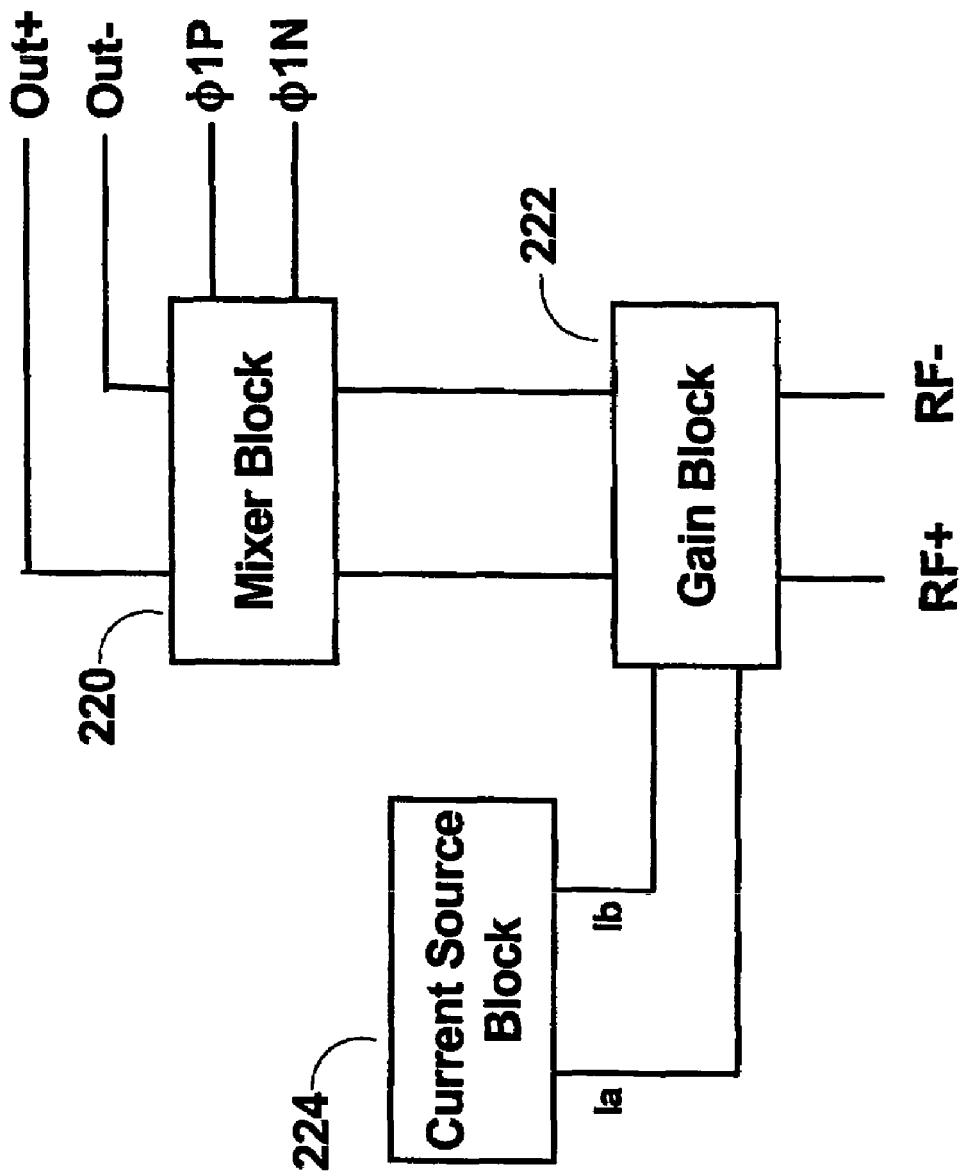
FIG. 6 presents a block diagram of a differential active mixer in an embodiment of the invention.
Figure 7:
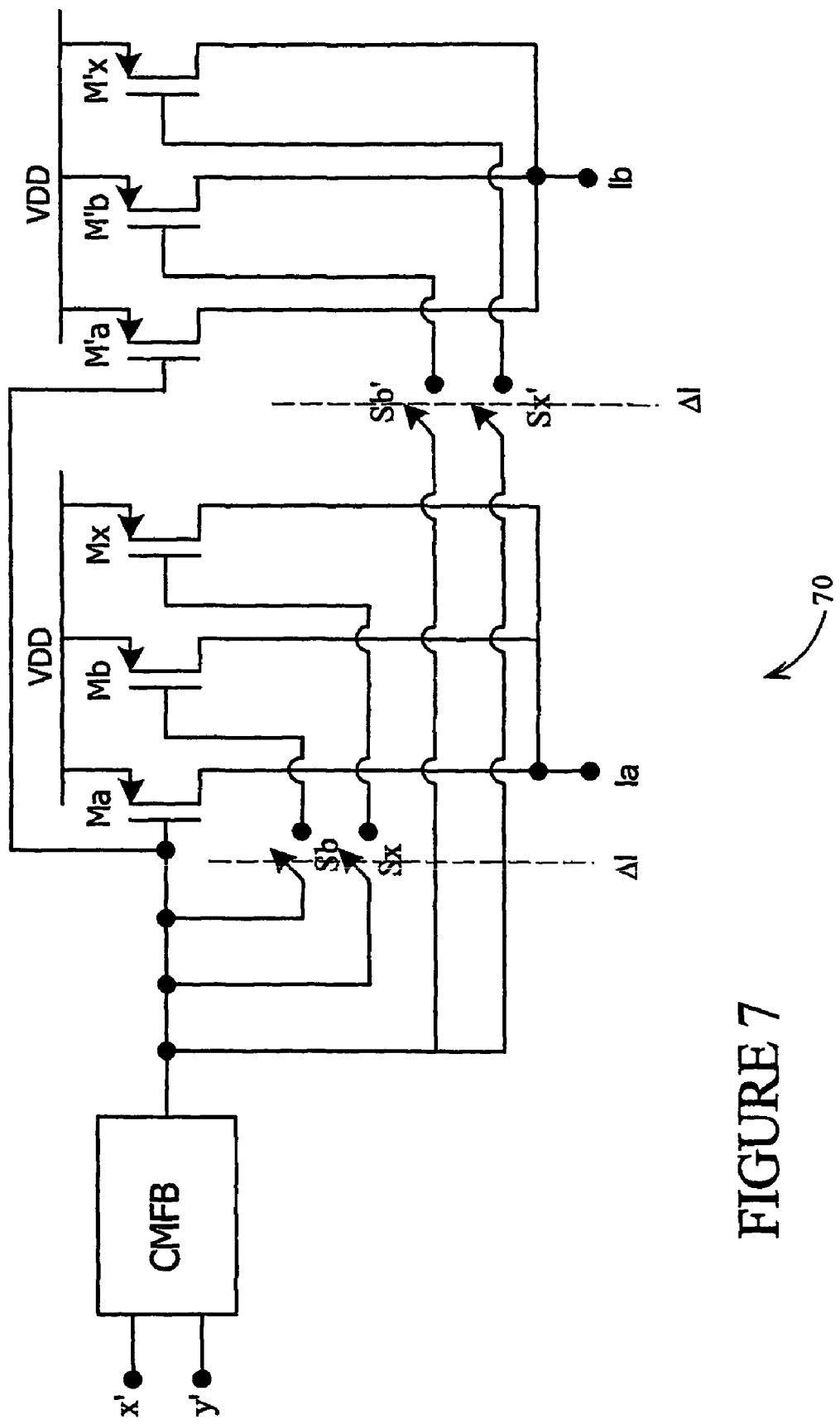
FIG. 7 presents an electrical schematic diagram of an adjustable current source in an embodiment of the invention.
Figure 8:
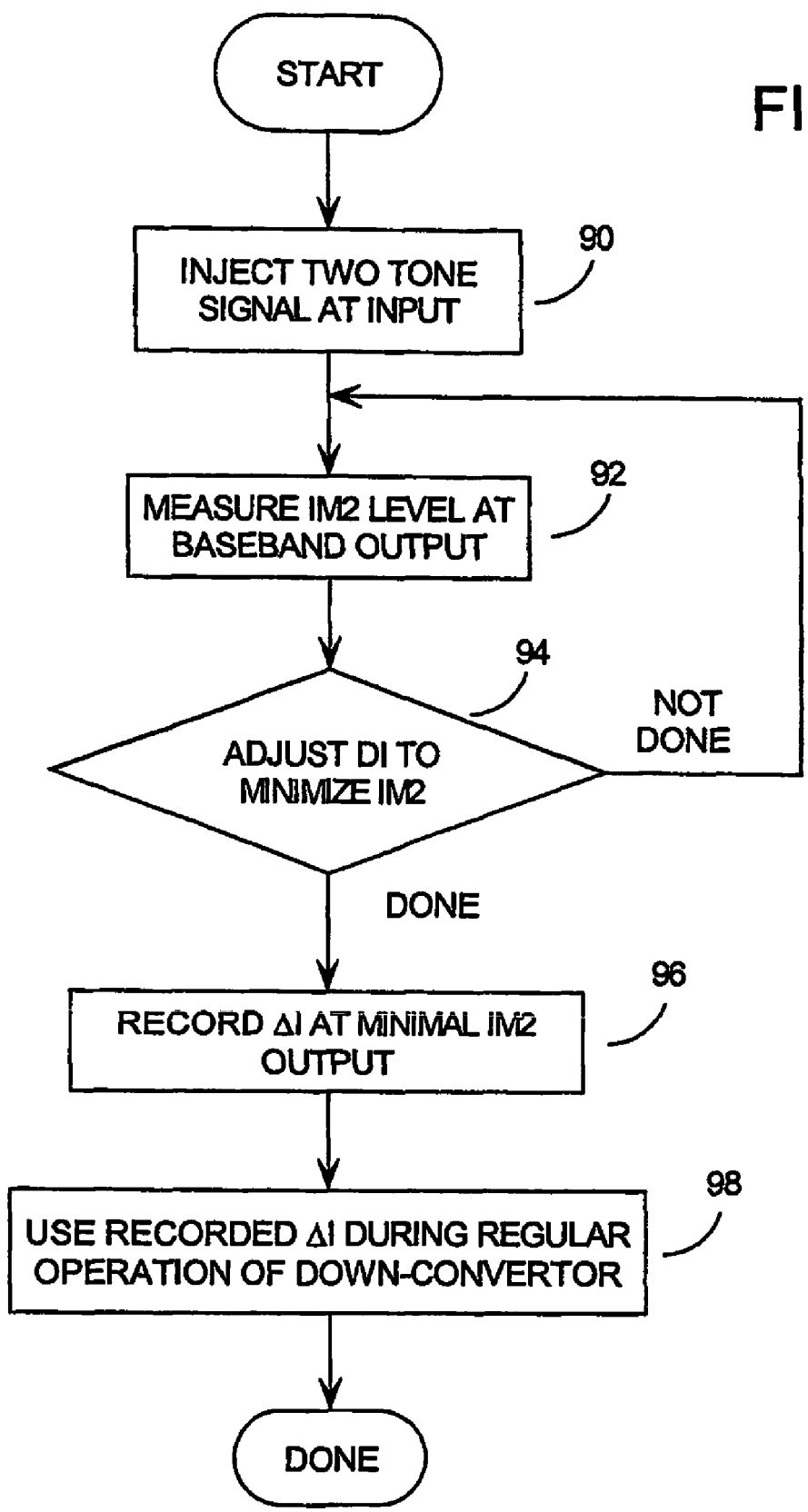
FIG. 8 presents a flow chart of a method of determining the trimming current, ΔI, in an embodiment of the invention.
Figure 9:
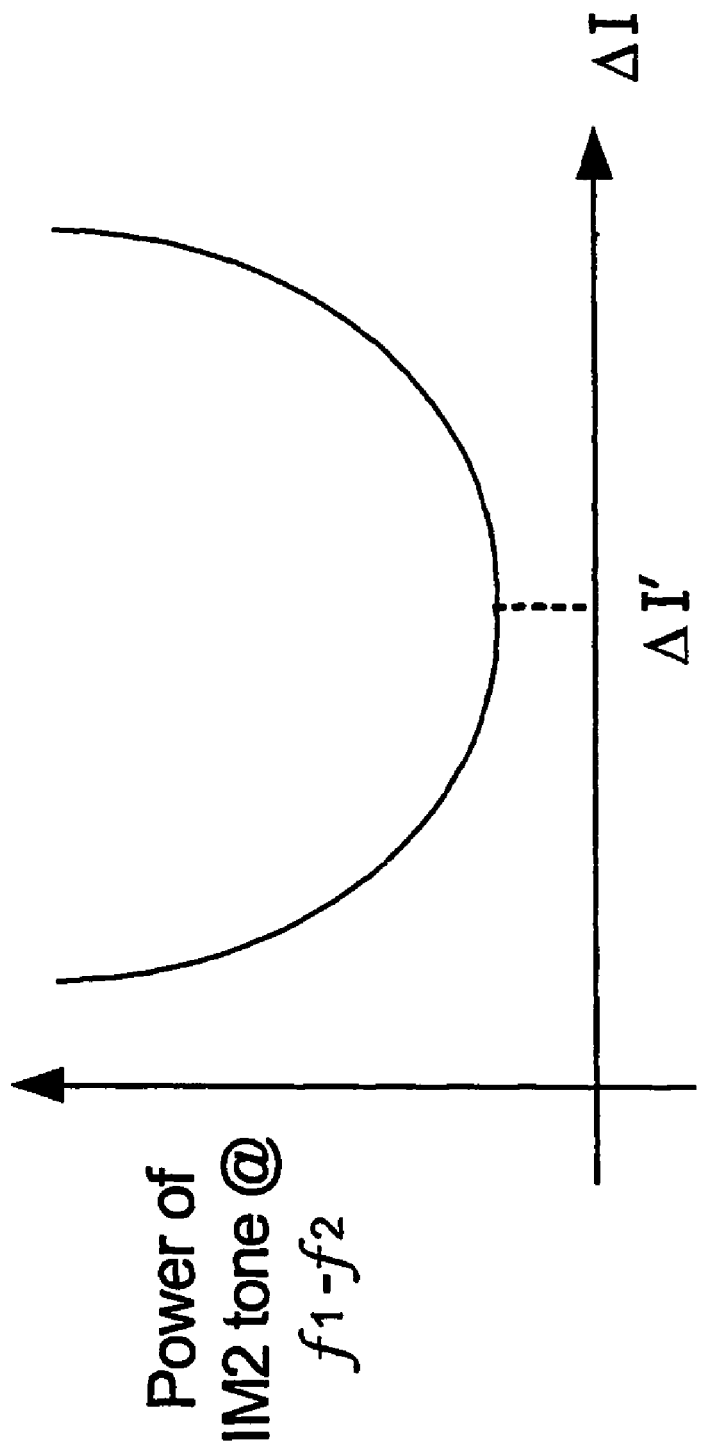
FIG. 9 presents a diagram demonstrating how order modulation noise (IM2 noise) changes with the trimming current, ΔI.

An exemplary implementation of the invention is presented in the schematic diagrams of FIGS. 5 through 9. FIG. 5 presents an electrical schematic diagram of the complete circuit, while FIG. 6 presents a generalization of the active mixer component of the topology. FIG. 7 presents a detail electrical schematic diagram of the current sources used in this embodiment. FIG. 8 presents a flow chart of a methodology for determining an optimal value for ΔI, while FIG. 9 presents a diagram showing how this methodology minimizes the IM2.

The circuit 68 presented in FIG. 5 can be described as having four major components: a pair of current sources 70, an active mixer circuit 72, a high pass filter (HPF) 74, and a passive mixer circuit 76. This circuit 68 receives a differential RF input signal x(t)+, x(t)−, and down-converts this signal to a differential baseband (BB) signal, BB+, BB−. At the LO ports of the two mixers 72, 76 differential mixing signals φ1P, φ1N, φ2P and φ2N are applied to down-convert the incoming RF signal to baseband. These differential mixing signals φ1P, φ1N, φ2P and φ2N could be standard super-heterodyne mixing signals, or could be VLO signals as described above.

The core of the topology in FIG. 5 consists of two mixers: a first mixer 72 which is active, and a second mixer 76, which is passive. Active mixers are distinct from passive mixers in a number of ways:

1. they provide conversion gain. Thus, an active mixer can replace the combination of a low noise amplifier and a passive mixer;
2. active mixers provide better isolation between the input and output ports because of the impedance of the active components; and
3. active mixers allow a lower powered mixing signal to be used, reducing the noise that results when the mixing signal is generated.

In spite of these advantages, the application of active mixers in modulation and demodulation topologies is still problematic. Because active mixers are non-linear devices, they generate more 1/f noise and produce second-order distortion. As noted above, 1/f noise is noise with a power spectra that increases as the frequency approaches DC (direct current).

The topology of the invention can exploit the advantages of an active mixer mainly because of the system for reducing DC offsets, but also because the high pass filter 74 and passive mixer 76 are used in the balance of the circuit 68. To begin with, the high pass filter 74 blocks out a great deal of the DC noise. Then, because the second mixer 76 is a passive mixer and it operates at a relatively lower frequency, it does not introduce a significant amount of second-order distortion into the signal. Thus, this topology provides the benefits of active mixing, without introducing second-order distortion into the output signal.

The operation of the pair of current sources 70 and active mixer circuit 72 will now be described with respect to the block diagram of FIG. 6.

A simplified representation of the current sources 70 and the active mixer 72 is presented in the block diagram of FIG. 5, where the components are collected into three groups: a Mixer Block 220, a Gain Block 222, and a Current Source Block 224.

Briefly, the Gain Block 222 is a gain-providing stage that consists of a number of input transistors, shown in FIG. 4 as transistors M5 and M6. These input transistors are fed with the differential input signals x(t)+ and x(t)−, and their outputs are fed to the Mixer Block 220 as amplified signals. The mixer block 220 consists of transistors M1 through M4 as shown in FIG. 5.

The Gain Block 222 is simply a single stage differential amplifier, consisting of two transistors M5 and M6, and two resistors R1 and R2. The degree of amplification is controlled via the voltage of the input signal Vb.

The Mixer Block 220 is effected by two separate transistor and resistor pairings, which receive the amplified RF signals from the Gain Block 222. The amplified RF signal from the Gain Block 222 is passed to the sources of the transistor switches M1, M2 and M3, M4, and the drains of transistors switches M1, M2 and M3, M4 are connected to load resistors R3 and R4. By feeding the gates of the switching transistors switches M1, M2 and M3, M4 with complementary mixing signals φ1P and φN, that is, φ1P=−(φ1N), a differential output signal is received. The value of the load resistors RI and RI is selected to provide the best bias conditions for the mixer transistors.

Additional details regarding the design and implementation of a suitable active mixer 72 are given in the co-pending patent application filed under Canadian Patent Application Serial No. 2,375,438, titled: "Improvements to a High Linearity Gilbert I Q Dual Mixer". Other active mixer designs may also be used, as known in the art, or variations on the above used.

The conditions of operation, and hence performance, of the Gain Block 222 are alterable through the Current Source Block 224 which provides a variable amount of biasing current to the Gain Block 222. The Current Source Block 224 provides current to the Gain Block 222 so that this current is not drawn entirely from the Mixer Block 230.

The reduced contribution of current to the Gain Block 222 via the Mixer Block 230 results in less noise being referred to the inputs of the RF amplifier transistors in the Gain Block 222 and also less noise being generated, resulting in improved overall noise performance. At the same time, the total current flowing through the RF amplifier transistors in the Gain Block 222 can be maintained at a level sufficient to ensure their operation at the required gain and linearity.

The current sources Ia and Ib are arranged to provide the current required by the RF amplifier transistors M5 and M6 thereby requiring the active mixer switches M1, M2 and M3, M4 to provide only a small proportion of the current required for the Gain Block 222. This results in improved overall noise performance.

The linearity of the active mixer 72 is also improved by this current injection between the input amplifier and the active mixer switches M1, M2 and M3, M4 because the current flowing through the input amplifier (Gain Block 222) can be substantially independent of that flowing through the active mixer switches M1, M2 and M3, M4.

Outputs from the switching transistors M1, M2 and M3, M4 in the active mixer 72 are then passed through a pair of high pass filters 74, each consisting of a capacitor C1 and C2 and two resistors R5 through R8. The use of the resistors in the configuration of voltage dividers across positive and negative voltage sources ($V_{DD}$ being positive and $V_{SS}$ being negative) not only serves to drain the capacitors of the high pass filter, but also sets the common mode voltage for the next mixing stage.

Also, note that the cut-off frequency of the pair of high pass filters 74 can be very low (either low with respect to the carrier frequency or close to DC, depending on the application and expected signals). As a result it may be considered to function almost entirely in the manner of a voltage divider. Also, the pair of high pass filters 74 might be effected in other manners, for example, in the form of an 'active resistor' network.

The outputs of the pair of high pass filters 74 are then passed to the inputs of the respective halves of the differential passive mixer 76, whose other inputs are the mixing signals φ2P and φ2N, which work in concert with the φ1P and φ1N mixing signals used in the active mixer 72. In FIG. 4, the passive mixer 74 comprises a known design having four transistors M7, M8, M9 and M10. Other architectures could also be used.

If VLO mixing signals are being used, this second mixing stage completes the emulation of the local oscillator mixing, frequency translating the input x(t)+ and x(t)− signal to the desired output signal φ1N φ2N x(t)− and φ1P φ2P x(t)+. If this circuit is being used to demodulate a signal down to baseband, as it would in the case of a radio receiver, it may then be desirable to pass the outputs of the passive mixer 76 through a low pass filter to remove any significant out-of-band signals.

One of the further benefits of this design is the use of simple resistive elements (R1 and R2) to fix the active mixer 72 biasing voltages. This assists in the selection of optimal performance parameters for the passive mixer 76.

The linearity of an active mixer is dependent on the biasing voltage of transistors. There are at least two sources of non-linearity in the active mixer 72: the non-linearity of the RF amplifier transistors and that of the switching transistors. The optimum biasing must be found through simulation or other techniques. The bias voltage applied to each of the drains of the active mixer switches is thereby selected and fixed to that necessary for optimum linearity during design.

FIG. 7 presents an exemplary circuit for implementing the current sources 70 of the invention. The two current sources are implemented using parallel arrays of transistors, controlled by electronic switches. The lowest level of Ia current, for example, will be equivalent to the current provided through transistor Ma. This current level can be increased using switches Sb through Sx to operate transistors Mb through Mx, connected in parallel to transistor Ma. These switches Sb . . . Sx are driven selectively by the level of the ΔI current. While only three transistors are shown for this channel, clearly a large number could be used.

Similarly, the Ib channel consists of a corresponding array of transistors M'b through M'x, connected in parallel to transistor M'a. The Ib channel will have a minimum current level determined by the current through transistor M'a, but this current can be increased using switches S'b through S'x (which, like the Ia channel, are driven by the level of the ΔI current).

This circuit 70 also includes a common mode feedback circuit (CMFB), which receives as an input, the outputs of the active mixer 72, x' and y'. The CMFB circuit receives this pair of signals and determines the common mode level for the two inputs, ensuring that the outputs x' and y' have a fixed common mode voltage.

Note that any CMFB circuit know in the art could be used, including the following:
1. a switched capacitor design;
2. a differential difference amplifier (DDA) design;
3. a resistor-averaged circuit; or
4. other designs.

Exemplary Method of Determining Trimming Current ΔI

FIG. 8 presents a flow chart of a methodology for determining and applying the trimming current (ΔI) value. As noted above, the desire is to determine two complementary current values which feed the active mixer 72: Ia=I+ΔI and Ib=I−ΔI. The ΔI value can be controlled using digital or/and analog methods, and is used to reduce the DC term at the output due to a large single tone input. In the preferred embodiment, the value of the current ΔI is determined as follows:

First, a two tone signal at frequencies f1 and f2 is injected at the x(t) input of the transconductance cell 52 of the circuit, at step 90. The IM2 tone (i.e. the tone at frequency f1-f2) is then measured at the BB output of the circuit, per step 92.

The power level of the IM2 is then minimized by adjusting ΔI per step 94, and continuously measuring changes to IM2 at step 92. Once a minimum value for IM2 is determined, control passes to step 94. At step 96, the value of ΔI which yields the minimum value for IM2, is stored on chip in any method know in the art This optimal value for ΔI is then used during regular operation of the circuit, per step 98. If an RF tone which is AM modulated is injected at the input of the transconductor, the amount of AM detection signal power at baseband is now minimized as a function of ΔI.

It is generally only necessary to determine the optimal value of ΔI once for any given chip, because its value will be determined by fabrication factors which do not vary greatly over the life of the chip. Thus, this process can be executed in the factory before delivery of the chip.

FIG. 9 presents a graph of how the second order distortion (IM2) is minimized. The x-axis on this figure represents the level of the trimming current ΔI input to the current sources, and the y-axis represents the corresponding level of IM2 distortion in the output at f1-f2. The circuit of the invention will generate a level of IM2 distortion which will vary with the ΔI input to the current sources, following a curve like that of FIG. 9, which will have a lowest point for some level of ΔI. The task is simply to determine the level of ΔI which generates the lowest IM2 distortion.

Figure 10:
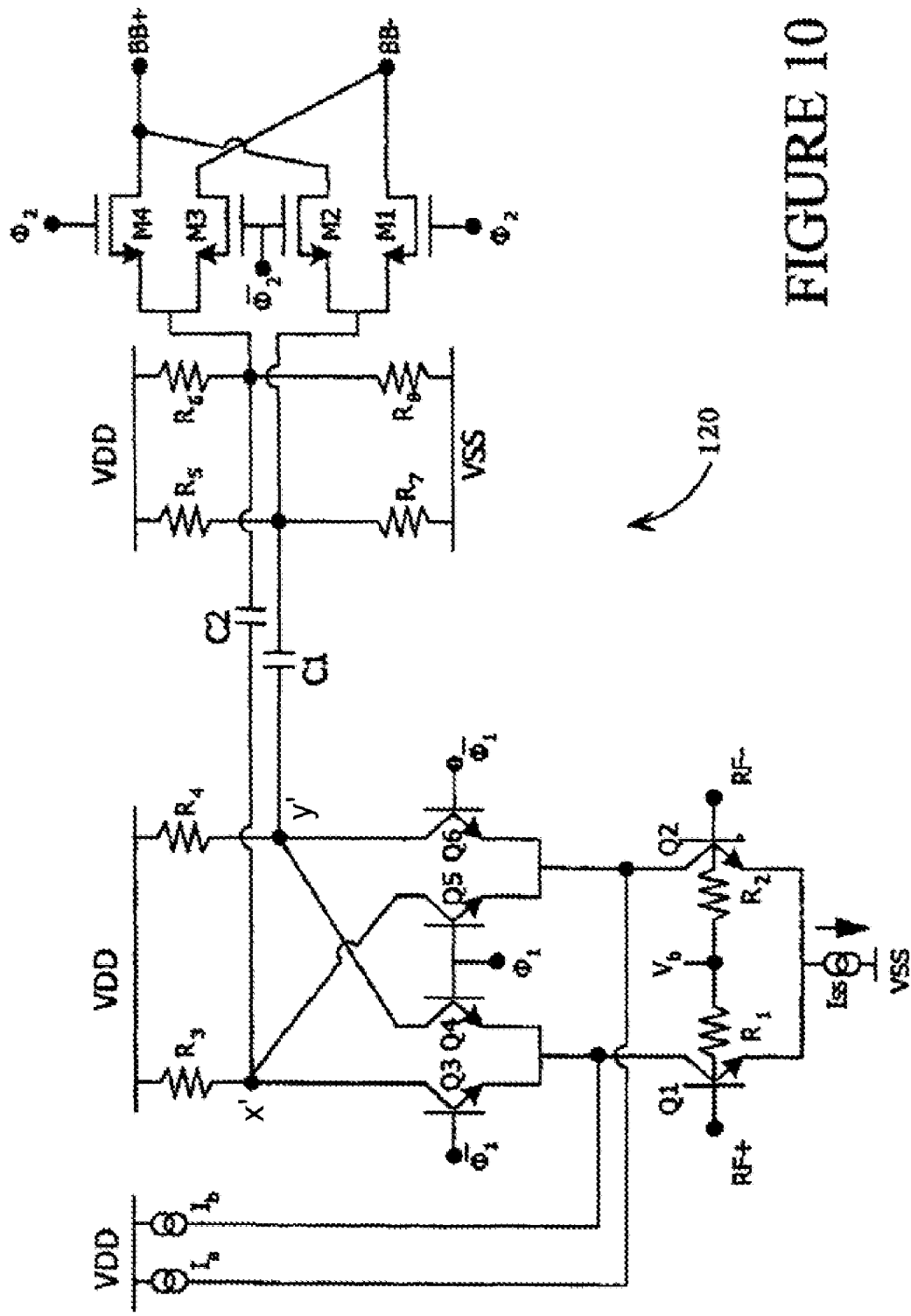
FIG. 10 presents an electrical schematic diagram of a differential demodulator topology in BiCMOS, in an embodiment of the invention.

The invention can be implement using bipolar technology, CMOS technology, BiCMOS technology, or another semiconductor technology. FIG. 10 presents a circuit diagram of a BiCMOS implementation 120 which is comparable to that of the FIG. 5 CMOS implementation.

The main differences between the BiCMOS and CMOS implementations are:
1. the active mixer 72 is implemented using transistors Q1 through Q6;
2. a current sink Is is required for the active mixer 72;
3. the passive mixer is implemented using transistors M1 through M4; and
4. the sense of the modulating signals 1P-, 1N-, 2P-, 2N- are changes to suit the polarities of the transistors as required.

The invention could also be implemented using other fabrication technologies including, but not limited to Silicon/Germanium (SiGe), Germanium (Ge), Gallium Arsenide (GaAs), and Silicon on Sapphire (SOS).

Advantages of the Invention

The invention provides many advantages over other down-convertors known in the art. To begin with, it offers:
1. minimal 1/f noise;
2. minimal imaging problems;
3. minimal leakage of a local oscillator (LO) signal into the RF output band;
4. removes the necessity of having a second LO as required by super-heterodyne circuits, and various (often external) filters; and
5. has a higher level of integration as the components it does require are easily placed on an integrated circuit. For example, no large capacitors or sophisticated filters are required.

A high level of integration results in decreased IC (integrated circuit) pin counts, decreased signal power loss, decreased IC power requirements, improved SNR (signal to noise ratio), improved NF (noise factor), and decreased manufacturing costs and complexity.

The design of the invention also makes the production of inexpensive multi-standard/multi-frequency communications transmitters and receivers a reality.

The benefits of the invention are most apparent when it is implemented within a single-chip design, eliminating the extra cost of interconnecting semiconductor integrated circuit devices, reducing the physical space they require and reducing the overall power consumption. Increasing levels of integration have been the driving impetus towards lower cost, higher volume, higher reliability and lower power consumer electronics since the inception of the integrated circuit. This invention will enable communications devices to follow the same integration route that other consumer electronic products have benefited from.

Options and Alternatives

A number of variations can be made to the topology of the invention including the following:
1. the invention could be implemented in a multi-band/multi-standard application.

A mixer topology that is suitable as part of a multi-band/multi-standard receiver, is described in detail in the co-pending patent application filed under the Patent Cooperation Treaty under application number PCT/CA02/01316, filed on Aug. 28, 2002, and titled Improved Apparatus And Method For Down-conversion.

The topology shown and described in this co-pending application is almost the same as that of FIG. 5. The difference is simply that it offers the added functionality of receiving more than one RF input, which can be electronically selected. This is effected simply by means of electronic switches connected to various RF inputs, the switches being used to control which RF signal is to applied to the mixing transistors; or 2. the invention could be implemented using in-phase and quadrature signals in many modulation schemes, it is necessary to modulate or demodulate both in-phase (I) and quadrature (Q) components of the input signal. In such a case, four modulation functions would have to be generated: φ1I which is 90 degrees out of phase with φ1Q; and φ2I which is 90 degrees out of phase with φ2Q. The pairing of signals φ1I and φ2I must meet the function selection criteria listed above, as must the signal pairing of φ1Q and φ2Q. Design of components to generate such signals would be clear to one skilled in the art from the description herein. As well, additional details on the generation of such signals are available in the co-pending patent applications filed under PCT International Application Serial Nos. PCT/CA00/00994, PCT/CA00/00995 and PCT/CA00/00996.

CONCLUSIONS

It will be apparent to those skilled in the art that the invention can be extended to cope with more than two or three standards, and to allow for more biasing conditions than those in the above description.

The electrical circuits of the invention may be described by computer software code in a simulation language, or hardware development language used to fabricate integrated Druids. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The construction of the necessary logic to generate the mixing signals of the invention would be clear to one skilled in the art from the description herein. Such signals may be generated using conventional methods and components including basic logic gates, field programmable gate arrays (FPGAs), programmable array logic (PALs) or gate array logic (GALs). The signals of the invention may also be stored on memory devices such as read only memories (ROMs), programmable read only memories (PROMs), erasable programmable read only memories (EPROMs), electrically erasable programmable read only memories (EEPROMS) or flash memory, and cycled out as required. The embodiments of the invention may also be implemented using processor-type devices such as digital signal processors (DSPs), microcontrollers, microprocessors, or similar devices as known in the art. Such implementations would be clear to one skilled in the art.

The embodiments of the invention may be implemented on various families of integrated circuit technologies using digital signal processors (DSPs), microcontrollers, microprocessors, field programmable gate arrays (FPGAs), or discrete components. Such implementations would be clear to one skilled in the art.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices; wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A method of signal demodulation for a circuit having a differential transconductance input cell consisting of separate positive and negative channels for receiving positive and negative channels of said input signal x(t) and amplifying said positive and negative channels of said input signal x(t); a first differential mixer for receiving said amplified input signal x(t), and mixing said input signal x(t) with a first mixing signal $\phi 1$, to generate an output signal $\phi 1$ x(t); a second differential mixer for receiving said signal $\phi 1$ x(t) as an input, and mixing said signal $\phi 1$ x(t) with a second mixing signal $\phi 2$, to generate an output signal $\phi 1$ $\phi 2$ x(t); a pair of current sources Ia and Ib for providing current to respective ones of said positive and negative channels of said differential transconductance input cell, to reduce the current drawn from said first differential mixer; said current sources Ia and Ib being trimmed in a complementary manner where Ia=I+$\Delta$I, and Ib=I-$\Delta$I; said method comprising the steps of:
    injecting a two-tone signal at said input;
    measuring IM2 at the baseband output of said circuit;
    determining the level of $\Delta$I which minimizes IM2;
    recording the level of $\Delta$I which minimizes IM2; and
    using said recorded level of $\Delta$I during normal operation of said down-convertor.

2. A computer readable memory medium for storing software code executable to perform the method steps of claim 1.

3. The method of claim 1, including operating a means for manipulating $\Delta$I to reduce the IM2 and DC offset in the output signal $\phi 1$ $\phi 2$ x(t), whereby matching parameters for said mixers can be relaxed.

4. The method of claim 1, including operating a means for setting a level of $\Delta$I.

5. The method of claim 1, wherein the current sources Ia and Ib each include parallel arrays of transistors, and the step of using includes selectively driving the parallel arrays of transistors with a level of $\Delta$I.

6. A method of down-converting a differential input signal x(t) comprising the steps of:
    amplifying positive and negative channels of said input signal x(t) using a differential transconductance input cell consisting of separate positive and negative channels;
    mixing said amplified input signal x(t) with a first mixing signal $\phi 1$, to generate an output signal $\phi 1$ x(t), using a first differential mixer;
    mixing said signal $\phi 1$ x(t) with a second mixing signal $\phi 2$, to generate an output signal $\phi 1$ $\phi 2$ x(t), using a second differential mixer; and
    providing current to respective ones of said positive and negative channels of said differential transconductance input cell, using a pair of current sources Ia and Ib, reducing the current drawn from said first differential mixer; and trimming said current sources Ia and Ib in a complementary manner where Ia=I+$\Delta$I, and Ib=I-$\Delta$I; wherein $\Delta$I can be manipulated to reduce the IM2 and DC offset in the output signal $\phi 1$ $\phi 2$ x(t), and wherein matching parameters for said mixers can be relaxed.

7. The method of claim 6, wherein ΔI is determined using a two-tone test, Al being the current level which minimizes IM2 output at baseband.

8. The method of claim 7, wherein the two-tone test includes injecting a two-tone signal as the input signal x(t);
   measuring IM2 of the output signal φ1 φ2 x(t);
   determining the level of ΔI which minimizes IM2;
   recording the level of ΔI which minimizes IM2; and
   using said recorded level of ΔI during the step of providing current.

9. The method of claim 6, wherein the current sources Ia and Ib each include parallel arrays of transistors, and the step of providing current includes selectively driving the parallel arrays of transistors with a level of ΔI.

* * * * *

UNITED STATES PATENT AND TRADEMARK OFFICE
CERTIFICATE OF CORRECTION

PATENT NO. : 7,263,344 B2
APPLICATION NO. : 10/531231
DATED : August 28, 2007
INVENTOR(S) : Tajinder Manku Page 1 of 1

It is certified that error appears in the above-identified patent and that said Letters Patent is hereby corrected as shown below:

Title page, item (60) domestic priority, delete "60/415,846" and insert therefor -- 60/418,846 --; and Column 17, line 2, claim 7, delete "Al" and insert therefor -- Al --

Signed and Sealed this

Fourth Day of December, 2007

JON W. DUDAS
*Director of the United States Patent and Trademark Office*